United States Patent
Wu et al.

(10) Patent No.: US 11,509,324 B2
(45) Date of Patent: Nov. 22, 2022

(54) ANALOG-TO-DIGITAL CONVERSION SYSTEM FOR STABILIZING SUPPLY VOLTAGE AND METHOD OF THE SAME

(71) Applicant: REALTEK SEMICONDUCTOR CORPORATION, Hsinchu (TW)

(72) Inventors: Shun-Ta Wu, Hsinchu (TW);
Chun-Hsiung Chang, Hsinchu (TW);
Chung-Ming Tseng, Hsinchu (TW);
Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/319,051

(22) Filed: May 12, 2021

(65) Prior Publication Data
US 2022/0231696 A1 Jul. 21, 2022

(30) Foreign Application Priority Data
Jan. 21, 2021 (TW) .................. 110102379

(51) Int. Cl.
*H03M 1/38* (2006.01)
*H03M 1/12* (2006.01)

(52) U.S. Cl.
CPC .......... *H03M 1/38* (2013.01); *H03M 1/1245* (2013.01)

(58) Field of Classification Search
CPC .............................. H03M 1/38; H03M 1/1245
USPC .......................................... 341/155, 120, 118
See application file for complete search history.

(56) References Cited

U.S. PATENT DOCUMENTS

| | | | |
|---|---|---|---|
| 8,669,893 B2 * | 3/2014 | Sawyers | G06G 7/16 323/273 |
| 9,223,332 B1 * | 12/2015 | Himmelbauer | G05F 1/10 |
| 9,935,643 B1 | 4/2018 | Chang et al. | |
| 2013/0154865 A1 * | 6/2013 | Fabregas | H03M 1/089 363/78 |

OTHER PUBLICATIONS

Cristian Raducan, Marius Neag, Capacitorless LDO with fast transient response based on a high slew-rate error amplifier, Cluj-Napoca, Romania.
Paul M. Furth, Srikar Krishnapurapu, Sri Harsh Pakala, Mohammad A, A 5.3 µA Quiescent Current Fully-Integrated Low-Dropout (LDO) Regulator with Transient Recovery Time Enhancement, New Mexico, USA.

(Continued)

*Primary Examiner* — Peguy Jean Pierre
(74) *Attorney, Agent, or Firm* — WPAT, P.C., Intellectual Property Attorneys; Anthony King

(57) ABSTRACT

An analog-to-digital conversion system includes an analog-to-digital converter and a power supply. The analog-to-digital converter is configured to convert an analog input signal to generate a digital output signal, and configured to generate a control signal according to a state of converting the analog input signal. The power supply is configured to provide a supply voltage to the analog-to-digital converter, and change the ability to provide the supply current of the power supply according to the control signal to stabilize the supply voltage.

20 Claims, 5 Drawing Sheets

(56) References Cited

OTHER PUBLICATIONS

Wei-Chung Chen, Tzu-Chi Huang, Chao-Chang Chiu, Chih-Wei Chang, Kuo-Chun Hsu, 94% Power-Recycle and Near-Zero Driving-Dead-Zone N-Type Low-Dropout Regulator with 20mV Undershoot at Short-Period Load Transient of Flash Memory in Smart Phone, ISSCC 2018, Session 27.

Jun Tang, Jaeseong Lee, Jeongjin Roh, Low-Power Fast-Transient Capacitor-Less LDO Regulator With High Slew-Rate Class-AB Amplifier, IEEE Transactions on circuits and system—II: Express briefs, vol. 66, No. 3, Mar. 2019.

Chun-Cheng Liu, Soon-Jyh Chang, Guan-Ying Huang, Ting-Zu Lin, A 10-bit 50-MS/s SAR ADC with a monotonic capacitor switching procedure, IEEE Journal of solid-state circuits, vol. 45, No. 4, Apr. 2010.

Office action dated Jul. 28, 2021 from the Taiwan corresponding application 110102379.

\* cited by examiner

ANALOG-TO-DIGITAL CONVERSION SYSTEM FOR STABILIZING SUPPLY VOLTAGE AND METHOD OF THE SAME

CROSS-REFERENCE TO RELATED APPLICATIONS

This application claims priority of Taiwan application No. 110102379 filed on Jan. 21, 2021, which is hereby incorporated herein by reference in its entirety.

TECHNICAL FIELD

The present application relates to a conversion system; in particular, to an analog-to-digital conversion system and an analog-to-digital conversion method.

BACKGROUND

Analog-to-digital converters require a significant amount of power to operate. When the power supply unit cannot provide sufficient power, the output voltage of the power supply unit will drop. At this time, the efficiency of the analog-to-digital converter operation is reduced. However, power consumption of the analog-to-digital converters is not high all the time. Therefore, how to match the power supply device with an analog-to-digital converter to perform power-consuming operations in order to maintain the performance of analog-to-digital converter operations has become one of the most critical issues in this field.

SUMMARY OF THE INVENTION

Some embodiments of the present disclosure provide an analog-to-digital conversion system including an analog-to-digital converter and a power supply. The analog-to-digital converter is configured to convert an analog input signal to generate a digital output signal and generate a control signal according to a state of converting the analog input signal. The power supply is configured to provide a supply voltage to the analog-to-digital converter and change an ability of providing a supply current of the power supply according to the control signal to stabilize the supply voltage.

Some embodiments of the present disclosure provide an analog-to-digital conversion method, which includes the following operations: converting an analog input signal to generate a digital output signal; generating a control signal according to a state of converting the analog input signal; and providing a supply voltage and a supply current. The step of providing a supply voltage and a supply current includes changing an ability of providing the supply current according to the control signal to stabilize the supply voltage.

Compared to the conventional technology, the analog-to-digital conversion system and method of the present disclosure use the state in which the analog-to-digital converter generates digital output signals to adjust the power supply's ability to provide supply current to maintain the performance of the analog-to-digital converter operation.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of some features may be arbitrarily increased or reduced for clarity of discussion.

DETAILED DESCRIPTION

Figure 1:
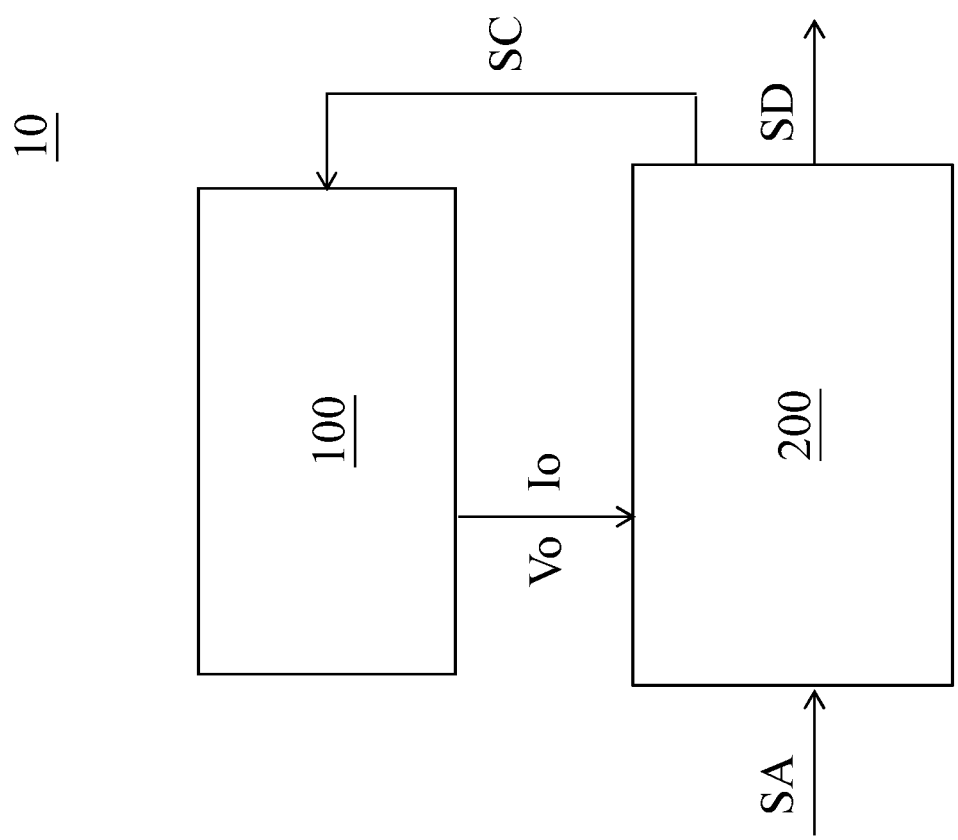
FIG. 1 is a schematic diagram illustrating an analog-to-digital conversion system according to some embodiments of the present disclosure.

FIG. 1 is a schematic diagram illustrating an analog-to-digital conversion system 10 according to some embodiments of the present disclosure. The analog-to-digital conversion system 10 includes a power supply 100 and an analog-to-digital converter (hereinafter referred as ADC) 200, which is configured to convert an analog input signal SA into a digital output signal SD.

The power supply 100 provides a supply voltage Vo and a supply current Io to the ADC 200, and then the ADC 200 uses the supply voltage Vo and the supply current Io to convert the analog input signal SA into the digital output signal SD.

The operation of the ADC 200 can include a high power consumption state, a low power consumption state, and an idle state. In this case, when the ADC 200 executes a sampling operation, the ADC 200 is in the low power consumption state. In contrast, when the ADC 200 executes a conversion operation, the ADC 200 is in the high power consumption state. The ADC 200 is in the idle state between the conversion operation is completed and another sampling operation is entered. In the sampling operation, the ADC 200 mainly samples the analog input signal SA. In the conversion operation, the ADC 200 mainly converts the sampled analog input signal SA to generate the digital output signal SD. In the sampling operation, a sampling circuit in the ADC 200 is substantially responsible for the operation, which consumes relatively low power. In the conversion operation, the power consumed by the operation of the ADC 200 is generally much greater than the power consumed by the sampling operation.

In the prior art, the peak power required by the ADC in the conversion operation is greater than the power provided by the power supply. In this case, when the ADC requires the peak power, the power provided by the power supply is insufficient to supply the ADC, so that the supply voltage drops, and the performance of the ADC is reduced.

Compared with the prior art, the analog-to-digital conversion system 10 according to the present disclosure can use the ADC 200 to generate the control signal SC to the power supply 100 according to the high power consumption state of the ADC 200 in the conversion operation when the ADC 200 generates the digital output signal SD during the conversion operation, so that the power supply 100 can change its ability to provide the supply current Io according to the control signal SC, thereby stabilizing the supplied supply voltage Vo that it provides. For details, please refer to the description in connection with FIG. 2 to FIG. 4.

Figure 2:
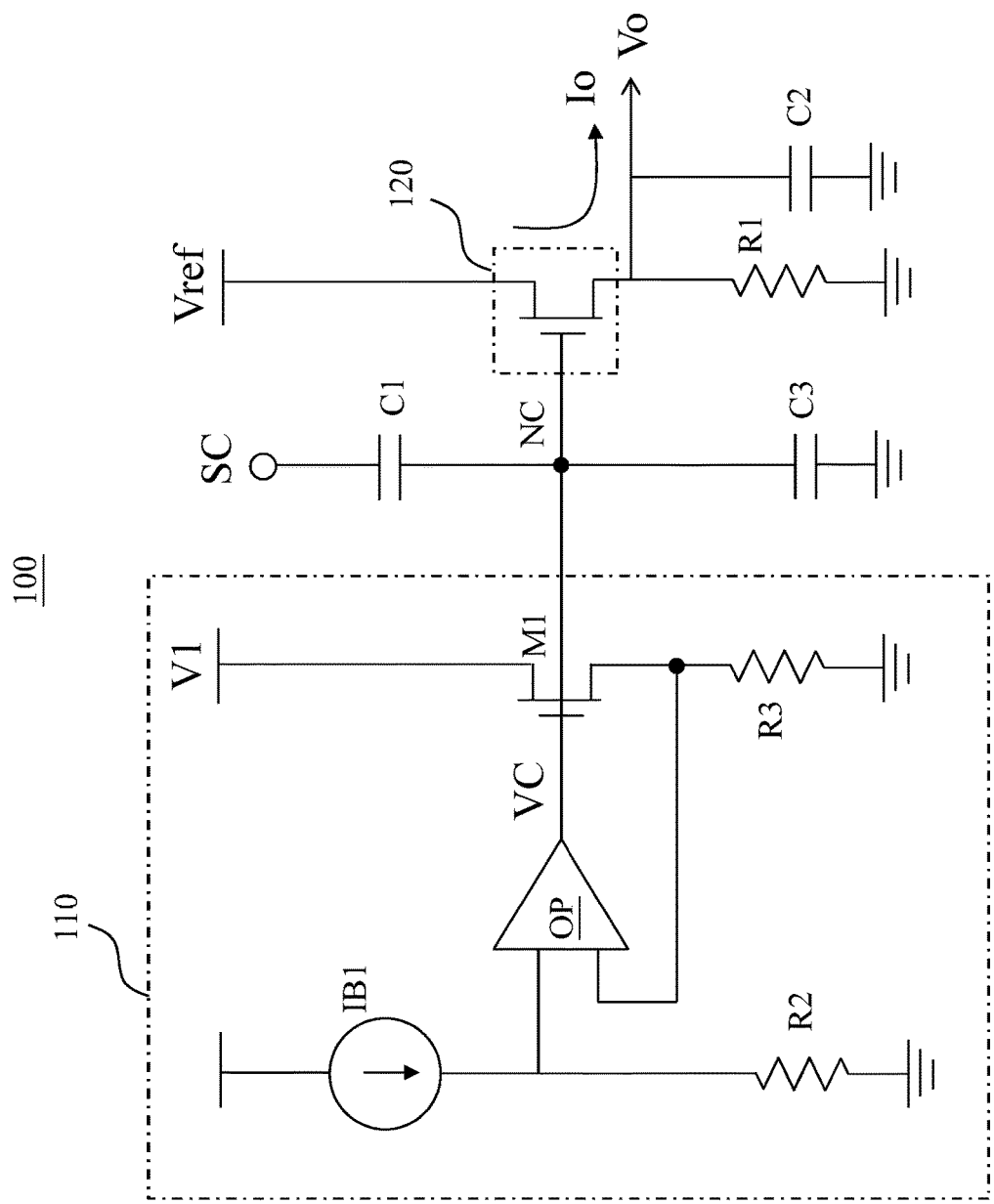
FIG. 2 is a schematic diagram illustrating a power supply according to some embodiments of the present disclosure.

FIG. 2 is a schematic diagram illustrating the power supply 100 according to some embodiments of the present disclosure. The power supply 100 includes a voltage control circuit 110, a power transistor 120, a capacitor C1, a capacitor C2, a capacitor C3, and a resistor R1. The voltage control circuit 110 is coupled to the control terminal of the power transistor 120 via a control node NC. The first terminal of the capacitor C1 is configured to receive the control signal SC, and the second terminal of the capacitor C1 is coupled to the control terminal of the power transistor 120 via the control node NC. The first terminal of the power transistor 120 is configured to receive a reference voltage Vref, the second terminal of the power transistor 120 is coupled to the first terminal of the capacitor C2 and the first terminal of the resistor R1. The second terminal of the power transistor 120 is configured to generate a supply voltage Vo, and the second terminal of the power transistor 120 is used to provide the supply current Io to the ADC 200. The second terminal of the capacitor C2 and the second terminal of the resistor R1 are connected to the ground. The first terminal of the capacitor C3 is coupled to the control terminal of the power transistor 120 via the control node NC, the second terminal of the capacitor C3 is connected to the ground. In some embodiments, the power supply 100 does not include the capacitor C3.

The voltage control circuit 110 is configured to generate a control voltage VC on the control node NC, and the power transistor 120 generates the supply voltage Vo and the supply current Io according to the reference voltage Vref and the voltage level on the control node NC. When the control signal SC is not at the ground level of the analog-to-digital conversion system 10, the voltage level at the control node NC is changed via the capacitor C1. Therefore, when the reference voltage Vref and the control voltage VC remain unchanged, the supply voltage Vo and the supply current Io generated by the power transistor 120 change as the voltage level of the control signal SC changes.

In some embodiments, the power transistor 120 is an N-type transistor. When the voltage level on the control node NC is increased, because the voltage level on the control terminal of the power transistor 120 increases, the ability of the power transistor 120 to provide the supply current Io is increased. In some embodiments, the control signal SC is a digital signal, which has a first level or a second level, wherein the second level is lower than the first level. When the control signal SC is at the first level, the current level of the supply current Io provided by the power transistor 120 is greater than the current level of the supply current Io provided by the power transistor 120 when the control signal SC is at the second level.

Reference is made to both FIG. 1 and FIG. 2. When the ADC 200 executes the sampling operation, the ADC 200 is in the low power consumption state, the power it consumes is reasonably low. The supply current Io does not flow substantially to the ADC 200, so that the supply voltage Vo on the second terminal of the power transistor 120 is kept stabilized. In the sampling operation, the ADC 200 depends less on the supply current Io. Therefore, the voltage level of the control signal SC is controlled at the second level (which is lower), which does not increase the ability of the power transistor 120 to provide the supply current Io. In some embodiments, in the sampling operation, because the supply current Io does not flow to the ADC 200, the first terminal of the capacitor C2 accumulates charges, thereby increasing the voltage level of the supply voltage Vo.

When the ADC 200 executes the conversion operation, the ADC 200 consumes a greater power than the power initially provided by the power supply 100 in certain periods. Compared to the sampling operation, the ADC 200 operating in the conversion operation is in the high power consumption state. To keep the stability of the supply voltage Vo, the voltage level of the control signal SC is controlled at the higher first level so as to increase the ability of the power transistor 120 to provide the supply current Io to match the power required by the ADC 200. When the power supplied by the power supply 100 is sufficient to meet the ADC 200's requirement, the supply voltage Vo will not decrease, thereby stabilizing the supply voltage Vo.

In some embodiments, the voltage control circuit 110 is configured to provide the control voltage VC with less noise. The voltage control circuit 110 includes a current source IB1, an amplifier OP, a transistor M1, a resistor R2, and a resistor R3. The current source IB1 is coupled to the positive input terminal of the amplifier OP and the first terminal of the resistor R2. The output terminal of the amplifier OP is coupled to the control node NC and the control terminal of the transistor M1. The first terminal of the transistor M1 is coupled to a system voltage V1. The negative input terminal of the amplifier OP is coupled to the first terminal of the resistor R3 and the second terminal of the transistor M1. The second terminals of the resistor R2 and the resistor R3 are connected to the ground.

Figure 3:
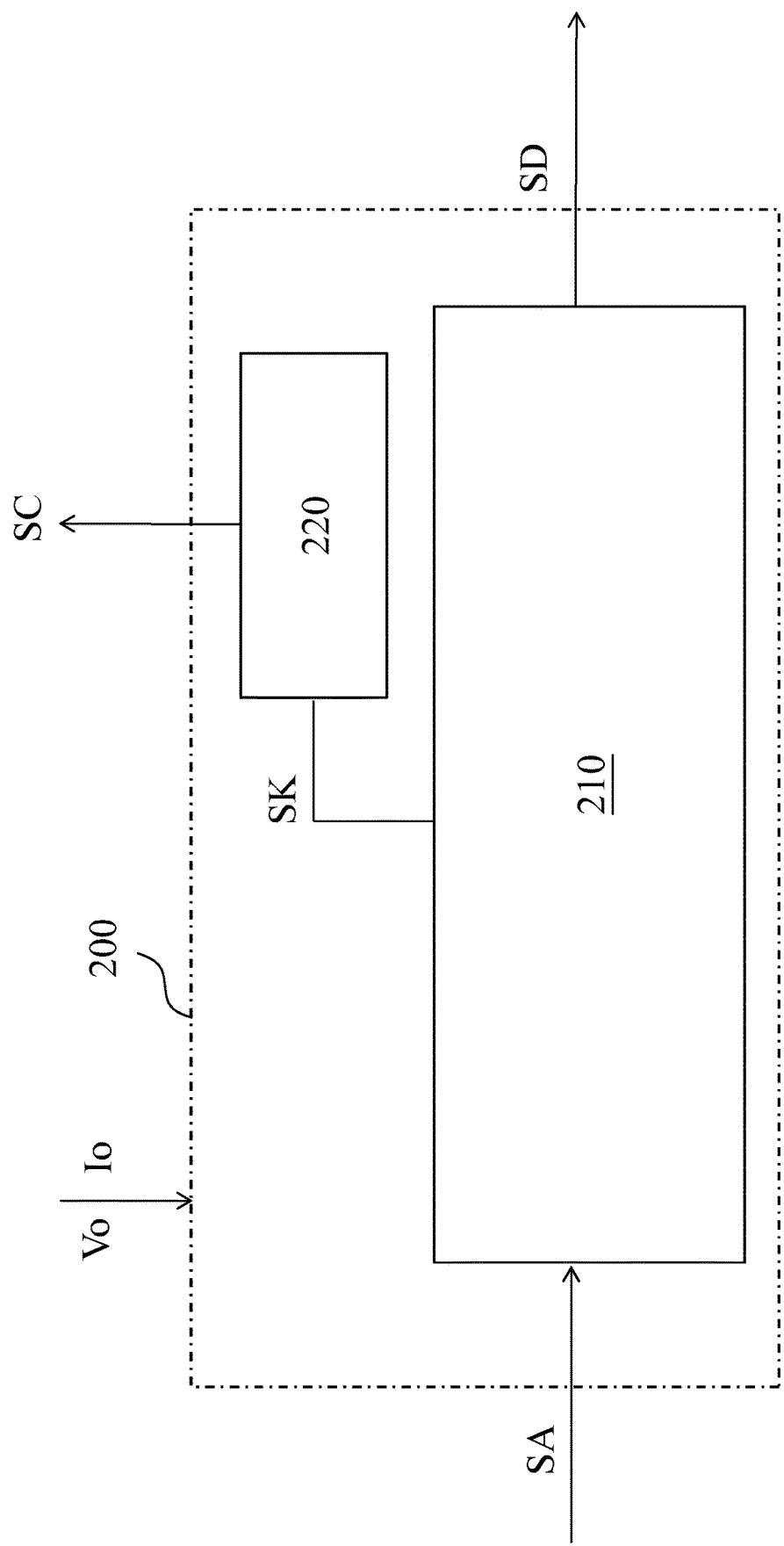
FIG. 3 is a schematic diagram illustrating an analog-to-digital converter according to some embodiments of the present disclosure.

Reference is made to FIG. 3. FIG. 3 is a schematic diagram illustrating the ADC 200 according to some embodiments of the present disclosure. The ADC 200 includes an analog-to-digital conversion circuit 210 and a control signal generation circuit 220. The control signal generation circuit 220 is configured to generate at least one conversion control signal SK to the analog-to-digital conversion circuit 210, so that the analog-to-digital conversion circuit 210 samples the analog input signal SA according to the at least one conversion control signal SK and converts the sampled analog input signal SA to generate the digital output signal SD. The control signal generation circuit 220 is further configured to generate the control signal SC to the power supply 100 according to the at least one conversion control signal SK.

In some embodiments, the ADC 200 is a successive-approximation register ADC (SAR ADC), which is configured to convert the analog input signal SA into n bits of the digital output signal SD. In the conversion mode, the analog-to-digital conversion circuit 210 converts the analog input signal SA to sequentially generate n bits of the digital output signal SD according to the at least one conversion control signal SK, wherein n is a positive integer. In some embodiments, during the period that the analog-to-digital conversion circuit 210 generates the first bit of the digital output signal SD (i.e., the most significant bit (MSB)) and the $n^{th}$ bit (i.e., the least significant bit (LSB)), the analog-to-digital conversion circuit 210 is in the above-mentioned high power consumption state.

The control signal generation circuit 220 generates the control signal SC according to the state in which the analog-to-digital conversion circuit 210 operates. Specifically, in the sampling operation, the control signal generation circuit 220 generates the control signal SC having the second level according to the at least one conversion control signal SK. In some embodiments, in the conversion operation, the control signal generation circuit 220 generates the control signal SC having the first level according to the at least one conversion control signal SK. As shown in FIG. 2, in the conversion operation, the control signal SC having the first level increases the ability of the power transistor 120 in FIG. 2 to provide the supply current Io.

In some other embodiments, in the conversion operation, the control signal generation circuit 220 generates the control signal SC having the first level during the period between the generation of the $x^{th}$ bit and the $y^{th}$ bit of the digital output signal SD, and generates the control signal SC having the second level during the periods between the generation of the first bit and the $x^{th}$ bit and between the $y^{th}$ bit and the $n^{th}$ bit of the digital output signal SD, according to the at least one conversion control signal SK. X and y are both positive integers, y is greater than x, and n is greater than or equal to y. That is, the power transistor 120's ability to provide the supply current Io is only increased during some periods of the conversion operation (as discussed above, the period between the generation of the first bit to the $n^{th}$ bit of the digital output signal SD belongs to the conversion operation; however, only the control signal SC for generating the $x^{th}$ bit and the $y^{th}$ bit of the digital output signal SD corresponds to a higher level). In other words, the control signal generation circuit 220 is configured to select a portion of the time period of the high power consumption state under the conversion operation to generate a control signal SC that can increase the ability of the power transistor 120 to provide a supply current to according to a state (the high power consumption state or the low power consumption state) regarding to the operation of the digital conversion circuit 210.

The operation in which the SAR ADC 200 generates the control signal SC according to the operation state of the analog-to-digital conversion circuit 210 (i.e., corresponding the control signal SC between the $x^{th}$ bit and the $y^{th}$ bit of the digital output signal SD to a higher level, and corresponding the control signal SC between the first bit and the $x^{th}$ bit and between the $y+1^{th}$ bit and the $n^{th}$ bit of the digital output signal SD to a lower level) can be implemented using the disclosure in Taiwan patent application No. 102101306 (Taiwan patent application publication No. TW 201429166 A), the content of which is incorporated herein in its entirety.

The arrangements of the power supply 100 and the ADC 200 discussed above are for illustration purposes only. Various arrangements of the power supply 100 and the ADC 200 are within the consideration and scope of the present disclosure. For example, in other embodiments, the power supply 100 can be implanted using the power supply 400 shown in FIG. 4.

Figure 4:
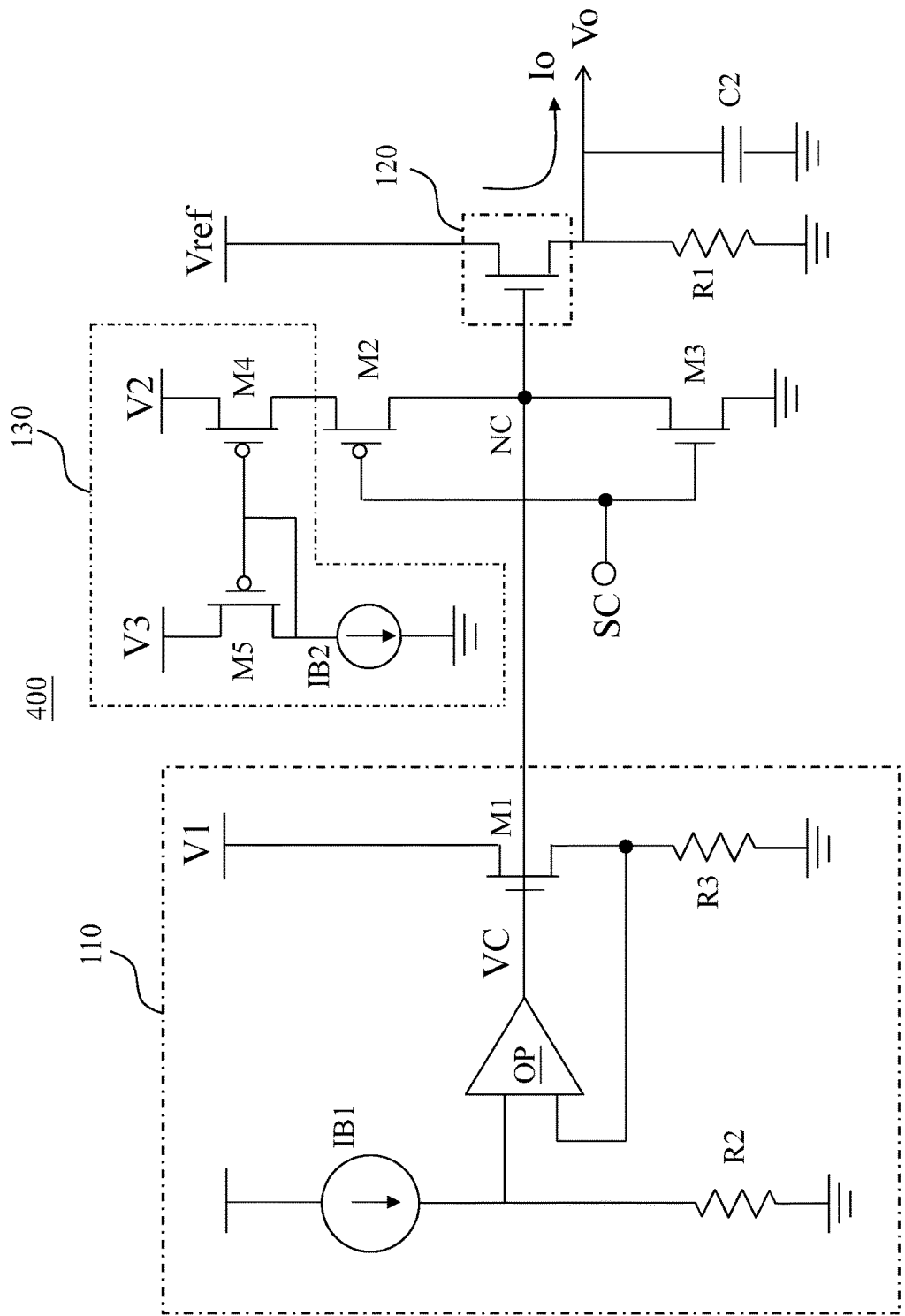
FIG. 4 is a schematic diagram illustrating a power supply according to some other embodiments of the present disclosure.

Reference is made to FIG. 4. FIG. 4 is a schematic diagram illustrating the power supply 400 according to other embodiments of the present disclosure. The power supply 400 includes the voltage control circuit 110, the power transistor 120, the capacitor C2, the resistor R1, a current mirror circuit 130, the transistor M2 and a transistor M3. The arrangements of the voltage control circuit 110, the power transistor 120, the capacitor C2, and the resistor R1 of the power supply 400 are substantially the same as the voltage control circuit 110, the power transistor 120, the capacitor C2, and the resistor R1 of the power supply 100 shown in FIG. 2, and hence, details of which are omitted herein for the sake of brevity.

As shown in FIG. 4, the current mirror circuit 130 is coupled to the first terminal of the transistor M2. The second terminal of the transistor M2 is coupled to the control terminal of the power transistor 120 via the control node NC. The first terminal of the transistor M3 is coupled to the control terminal of the power transistor 120 via the control node NC, the second terminal of the transistor M3 is connected to the ground. The control terminal of the transistor M2 and the control terminal of the transistor M3 are configured to receive the control signal SC. In some embodiments, the current mirror circuit 130 includes a transistor M4, a transistor M5, and a current source IB2. The first terminal of the transistor M4 is configured to receive a system voltage V2, the second terminal of the transistor M4 is coupled to the first terminal of the transistor M2, the control terminal of the transistor M4 is coupled to the control terminal of the transistor M5, the second terminal of the transistor M5 and the first terminal of the current source IB2, the first terminal of the transistor M5 is configured to receive a system voltage V3, the second terminal of the current source IB2 is connected to the ground. In some embodiments, the system voltage V2 and the system voltage V3 are substantially equal.

In some embodiments, the transistor M2 is a P-type transistor, the transistor M3 is an N-type transistor. When the control signal SC has the first level, the transistor M2 is disabled and the transistor M3 is enabled. The voltage level of the control node NC is decreased as a result of the transistor M3 being enabled, so that the power transistor 120's ability to provide the supply current Io decreases. When the control signal SC has the second level, the transistor M3 is disabled and the transistor M2 is enabled. The voltage level of the control node NC is increased as a result of the transistor M2 being enabled, so that the power transistor 120's ability to provide the supply current to increases.

Figure 5:
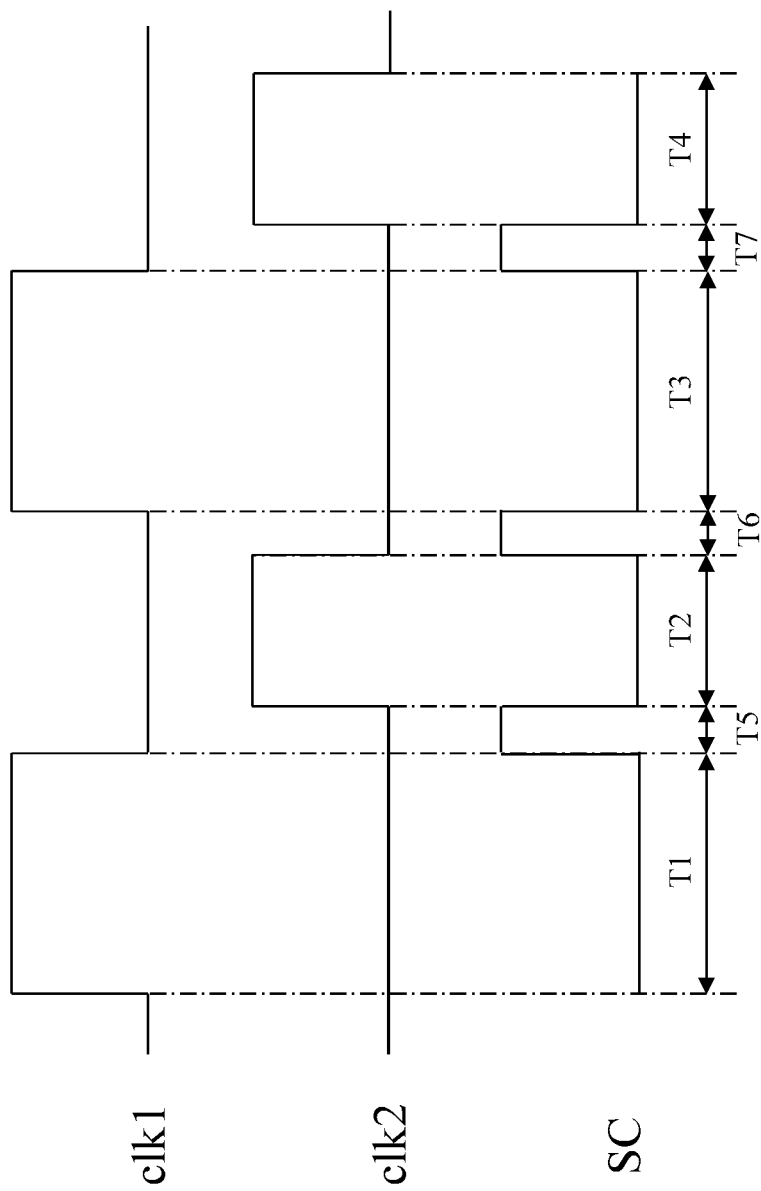
FIG. 5 is a schematic diagram illustrating a control signal's waveform according to some other embodiments of the present disclosure.

Reference is made to FIG. 3, FIG. 4, and FIG. 5 at the same time. In other embodiments, the ADC 200 shown in FIG. 3 is a pipeline ADC, wherein the pipeline ADC 200 uses a clock signal clk1 and a clock signal clk2 of the at least one conversion control signal SK to control it in the sampling operation or the conversion operation. In FIG. 5, when one of the clock signal clk1 and the clock signal clk2 has the first level (such as, time T1, T2, T3, T4), the pipeline ADC 200 is controlled in the sampling operation. When both the clock signal clk1 and the clock signal clk2 have the second level (such as, time T5, T6, T7), the pipeline ADC 200 is controlled in the conversion operation. In the sampling operation, the ADC 200 generate the control signal SC having the first level to the power supply 400. In the conversion operation, the ADC 200 generate the control signal SC having the second level to the power supply 400. Based on such operations, the power supply 400's ability to provide the supply current Io in the conversion operation could be increased so that the supply voltage Vo tends to be stable. In some embodiments, the control signal generation circuit 220 performs a NAND gate logic operation on the clock signal clk1 and the clock signal clk2 to generate the control signal SC. According to the NAND gate logic operation, one of the clock signal clk1 and the clock signal clk2 has the first level and the control signal SC has the second level. When both the clock signal clk1 and clock signal clock signal clk2 have the second level, the control signal SC has the first level.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. An analog-to-digital conversion system, comprising:
   an analog-to-digital converter, configured to convert an analog input signal to generate a digital output signal and generate a control signal according to a state of converting the analog input signal, wherein in a sampling operation, the state of converting the analog input signal is a low power consumption state, and in a conversion operation, the state of converting the analog input signal is a high power consumption state; and
   a power supply, configured to provide a supply voltage to the analog-to-digital converter and change an ability of providing a supply current of the power supply according to the control signal to stabilize the supply voltage.

2. The analog-to-digital conversion system of claim 1, wherein the power supply comprises:
   a voltage control circuit, configured to generate a control voltage on a control node; and
   a power transistor, wherein a first terminal of the power transistor is configured to receive a reference voltage, a control terminal of the power transistor is configured to be coupled to the control node, and the power transistor is configured to output the supply voltage on a second terminal of the power transistor according to the reference voltage, the control voltage, and the control signal.

3. The analog-to-digital conversion system of claim 2, wherein the power supply further comprises:
   a first capacitor, wherein a first terminal of the first capacitor is configured to receive the control signal, and a second terminal of the first capacitor is configured to be coupled to the control node;
   a second capacitor, wherein a first terminal of the second capacitor is coupled to the second terminal of the power transistor, and a second terminal of the second capacitor is coupled to a ground terminal; and
   a first resistor, wherein a first terminal of the first resistor is coupled to the second terminal of the power transistor, and a second terminal of the first resistor is coupled to the ground terminal.

4. The analog-to-digital conversion system of claim 3, wherein the power supply further comprises:
   a third capacitor, coupled between the control node and the ground terminal.

5. The analog-to-digital conversion system of claim 3, wherein
   the control signal has a first level or a second level, wherein the second level is lower than the first level, and
   the analog-to-digital converter is selectively operated in the sampling operation and the conversion operation, wherein in the sampling operation, the analog-to-digital converter generates the control signal corresponding to the second level, and in the conversion operation, the analog-to-digital converter generates the control signal corresponding to the first level or the second level,
   wherein in the conversion operation, the control signal is configured to increase a voltage level of the control node via the first capacitor, so as to increase the ability of providing the supply current of the power supply.

6. The analog-to-digital conversion system of claim 5, wherein the power transistor is an N-type transistor, and when the voltage level of the control node increases, a current level of the supply current passing through the first terminal and the second terminal of the power transistor is increased.

7. The analog-to-digital conversion system of claim 6, wherein the current level of the supply current when the control signal corresponds to the first level is greater than the current level when the control signal corresponds to the second level.

8. The analog-to-digital conversion system of claim 5, wherein the analog-to-digital converter comprises:
   a control signal generation circuit, configured to generate at least one conversion control signal; and
   an analog-to-digital conversion circuit, configured to sample the analog input signal according to the at least one conversion control signal in the sampling operation, and convert the sampled analog input signal according to the at least one conversion control signal to sequentially generate n bits of the digital output signal in the conversion operation,
   wherein the control signal generation circuit is further configured to generate the control signal having the first level between an xth bit and a yth bit of the n bits of the digital output signal generated by the analog-to-digital conversion circuit, wherein n, x, and y are all positive integers, y is greater than x, and n is greater than or equal to y.

9. The analog-to-digital conversion system of claim 2, wherein the power supply further comprises:
   a current mirror circuit;
   a first transistor, wherein a first terminal of the first transistor is coupled to the current mirror circuit, a second terminal of the first transistor is coupled to the control node, and a control terminal of the first transistor is configured to receive the control signal; and
   a second transistor, wherein a first terminal of the second transistor is coupled to the control node, a second terminal of the second transistor is coupled to the ground terminal, and a control terminal of the second transistor is configured to receive the control signal,
   wherein when the control signal has a first level, the first transistor is disabled and the second transistor is enabled, so that a voltage level on the control node decreases, and when the control signal has a second level that is lower than the first level, the second transistor is disabled and the first transistor is enabled, so that the voltage level on the control node increases.

10. The analog-to-digital conversion system of claim 9, wherein the analog-to-digital converter is selectively operated in the sampling operation and the conversion operation, and the analog-to-digital converter is configured to sample the analog input signal and generate the control signal having the first level in the sampling operation, and configured to convert the sampled analog input signal and generate the control signal having the second level in the conversion operation.

11. An analog-to-digital conversion method, comprising:
   converting an analog input signal to generate a digital output signal;
   generating a control signal according to a state of converting the analog input signal, wherein in a sampling operation, the state of converting the analog input signal is a low power consumption state, and in a conversion operation, the state of converting the analog input signal is a high power consumption; and
   providing a supply voltage and a supply current, comprising:
     changing an ability of providing the supply current according to the control signal to stabilize the supply voltage.

12. The analog-to-digital conversion method of claim 11, wherein the step of providing the supply voltage and the supply current further comprises:
- receiving a reference voltage by a first terminal of a power transistor;
- generating a control voltage; and
- outputting the supply voltage by a second terminal of the power transistor, according to the reference voltage, the control voltage, and the control signal.

13. The analog-to-digital conversion method of claim 12, wherein the step of outputting the supply voltage according to the reference voltage, the control voltage, and the control signal comprises:
- receiving the control signal by a first terminal of a first capacitor; and
- receiving the control voltage and coupling to a second terminal of the first capacitor by a control terminal of the power transistor.

14. The analog-to-digital conversion method of claim 13, wherein the step of providing the supply voltage and the supply current further comprises:
- connecting the control terminal of the power transistor to a ground via a second capacitor.

15. The analog-to-digital conversion method of claim 13, wherein the control signal has a first level or a second level, wherein the second level is lower than the first level, wherein in the sampling operation, the control signal has the second level, and in the conversion operation, the control signal has the first level or the second level,
- wherein in the conversion operation, a voltage level the control terminal of the power transistor is increased by the control signal via the first capacitor, so as to increase the ability of providing the supply current of the power transistor.

16. The analog-to-digital conversion method of claim 15, wherein the power transistor is an N-type transistor, and when the voltage level of the control terminal of the power transistor is increased, a current level of the supply current passing through the first terminal and the second terminal of the power transistor is increased.

17. The analog-to-digital conversion method of claim 16, wherein the current level of the supply current when the control signal corresponds to the first level is greater than the current level when the control signal corresponds to the second level.

18. The analog-to-digital conversion method of claim 15, wherein the step of converting the analog input signal to generate the digital output signal comprises:
- generating at least one conversion control signal;
- sampling the analog input signal according to the at least one conversion control signal in the sampling operation; and
- converting the sampled analog input signal to sequentially generate n bits of the digital output signal according to the at least one conversion control signal in the conversion operation,
wherein the step of generating the control signal according to the state of converting the analog input signal comprises:
- generating the control signal having the first level between an xth bit and a yth bit of the n bits of the digital output signal generated by the analog-to-digital conversion circuit, wherein n, x, and y are all positive integers, y is greater than x, and n is greater than or equal to y.

19. The analog-to-digital conversion method of claim 12, wherein when the control signal has a first level, a voltage level on a control terminal of the power transistor is decreased, and when the control signal has a second level that is lower than the first level, the voltage level on the control terminal of the power transistor is increased.

20. The analog-to-digital conversion method of claim 19, wherein the step of converting the analog input signal to generate the digital output signal comprises:
- sampling the analog input signal in the sampling operation; and
- converting the sampled analog input signal in the conversion operation,
wherein the step of generating the control signal according to the state of converting the analog input signal comprises:
- generating the control signal having the first level in the sampling operation; and
- generating the control signal having the second level in the conversion operation.

\* \* \* \* \*